(12) United States Patent
Ghelmansarai

(10) Patent No.: US 6,281,507 B1
(45) Date of Patent: Aug. 28, 2001

(54) INTERDIGITAL PHOTOCONDUCTOR STRUCTURE FOR DIRECT X-RAY DETECTION IN A RADIOGRAPHY IMAGING SYSTEM

(75) Inventor: Farhad Abbasi Ghelmansarai, Walnut Creek, CA (US)

(73) Assignee: Siemens Medical Systems, Inc., Iselin, NJ (US)

( * ) Notice: Subject to any disclaimer, the term of this patent is extended or adjusted under 35 U.S.C. 154(b) by 0 days.

(21) Appl. No.: 09/343,307

(22) Filed: Jun. 30, 1999

(51) Int. Cl.[7] .................................................. G01T 1/24
(52) U.S. Cl. ..................................... 250/370.09; 250/580
(58) Field of Search ....................... 250/370.09, 580; 378/28

(56) References Cited

U.S. PATENT DOCUMENTS

| | | | |
|---|---|---|---|
| 4,176,275 | * 11/1979 | Korn et al. | 250/213 |
| 4,593,304 | * 6/1986 | Slayman et al. | 357/30 |
| 4,775,880 | 10/1988 | Suzuki et al. | 357/30 |
| 5,268,569 | * 12/1993 | Nelson et al. | 250/370.09 |
| 5,313,066 | * 5/1994 | Lee et al. | 250/370.09 |
| 5,319,206 | 6/1994 | Lee et al. | |
| 5,381,014 | 1/1995 | Jeromin et al. | |
| 5,396,072 | 3/1995 | Schiebel et al. | 250/370 |
| 5,563,421 | 10/1996 | Lee et al. | |
| 5,598,004 | * 1/1997 | Powell et al. | 250/370.09 |
| 5,821,539 | 10/1998 | Jahnke et al. | 250/370.01 |

FOREIGN PATENT DOCUMENTS

| | | | |
|---|---|---|---|
| 34 15 439 | 10/1985 | (DE) | H01L/31/10 |
| 0 582 397 | 2/1994 | (EP) | G01T/1/202 |
| WO 98/44568 | 10/1998 | (WO) | H01L/31/10 |

OTHER PUBLICATIONS

Sterling Diagnostic Imaging, Inc., Glasgow, Delaware, "Direct Digital Flat–Panel Radiographic Detector: Principle and 14×17–inch Images", Lawrence K. Cheung, Phd; Denny L. Lee, PhD; Lothar S. Jeromin, PhD.

\* cited by examiner

Primary Examiner—Robert H. Kim
Assistant Examiner—Irakli Kiknadre

(57) ABSTRACT

System and method aspects for a photoconductive element for direct x-ray detection in a radiography imaging system are described. The photoconductive element includes a photoconductive material layer for absorbing x-ray radiation transmitted through an object being imaged by the radiography imaging system. Further included is an interdigital contact structure in the photoconductive material layer.

19 Claims, 3 Drawing Sheets

INTERDIGITAL PHOTOCONDUCTOR STRUCTURE FOR DIRECT X-RAY DETECTION IN A RADIOGRAPHY IMAGING SYSTEM

RELATED APPLICATIONS

The present application is related to co-pending U.S. patent application Ser. No. 09/343,313, entitled AN INTERDIGITAL PHOTODETECTOR FOR INDIRECT X-RAY DETECTION IN A RADIOGRAPHY IMAGING SYSTEM (99E7464US, filed on even date herewith), and assigned to the assignee of the present invention.

FIELD OF THE INVENTION

The present invention relates to radiography imaging systems and more particularly to a photoconductor structure for direct x-ray detection in a radiography imaging system.

BACKGROUND OF THE INVENTION

Traditionally, medical diagnostic processes record x-ray image patterns on silver halide films. These systems direct an initially uniform pattern of interrogating x-ray radiation through a patient to be studied, intercept the consequently imagewise modulated pattern of x-ray radiation with an x-ray radiation intensifying screen, record the intensified pattern in a silver halide film, and chemically transform the latent radiation pattern into a permanent and visible image called a radiogram.

Radiograms have also been produced by using layers of radiation sensitive materials to directly capture radiographic images as imagewise modulated patterns of electrical charges. Depending upon the intensity of the incident X-ray radiation, electrical charges generated either electrically or optically by the X-ray radiation within a pixelized area are quantized using a regularly arranged array of discrete solid state radiation sensors.

There has been rapid development of large area, flat panel, digital x-ray imaging detectors for digital radiology using active matrix technologies. An active matrix consists of a two-dimensional array of thin film transistors (TFTs) made with amorphous or polycrystalline semiconductor materials. There are two general approaches to making flat-panel x-ray detectors, direct or indirect. The direct method is also referred to as a self-scanned α-Se (amorphous selenium). The indirect method uses phosphor screens or other scintillators to first convert x-rays to visible light, which is then read out with an active matrix array with an additional light sensor at each pixel of the array. The direct method offers the advantages of higher screen resolution provided by electrostatic image formation, elimination of the phosphor screen, and simpler active matrix structure.

The usefulness of photoconductors as x-ray imaging sensors arises from the high sensitivity, i.e., conversion of absorbed x-ray energy to charge, if an appropriate electric field is applied. While a number of photoconductors may be used for x-ray imaging detectors, amorphous selenium is considered particularly well-suited for the task, since it is well-developed technologically, it has been used traditionally as a photoconductor in photocopiers and xeroradiography, it can be made relatively easily and inexpensively in its amorphous form by evaporation in a large area, and it has a uniqueness in its remarkably low dark current. Further, a large intrinsic gain results from its large difference between the hole mobility and electron mobility for ohmic contacts.

While achieving advantages over traditional film radiography, photoconductor use in x-ray imaging has its share of difficulties. Image lag is a problem when utilizing direct x-ray detection. Image lag or a delay in acquiring an image is effected by two sources. A first source is incomplete charge collection i.e., photoconductive lag and a second source is incomplete charge readout i.e., image readout lag. What is desired is a system and method for reducing the photoconductive lag in a cost effective and efficient manner. The present invention addresses such a need.

SUMMARY OF THE INVENTION

The present invention provides system and method aspects for a photoconductive element for direct x-ray detection in a radiography imaging system. The photoconductive element includes a photoconductive material layer for absorbing x-ray radiation transmitted through an object being imaged by the radiography imaging system. Further included is an interdigital contact structure in the photoconductive material layer.

The interdigital contact structure in accordance with the present invention reduces the gap between electrodes, which results in a very short photoconductive lag. Also, a small electrode gap supports an increase in the gain of the detector, since the gain is inversely proportional to the distance between the electrodes and also reduces the bias voltage for a specific electric field. The metallic electrodes not only increase the stopping power of x-ray radiation but emit secondary particles which generate new charge carriers in photoconducting layer. These and other advantages of the aspects of the present invention will be more fully understood in conjunction with the following detailed description and accompanying drawings.

DETAILED DESCRIPTION OF THE INVENTION

The present invention relates to interdigital photoconductor for a radiography imaging system. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be merely limited to the embodiment shown but is to be accorded the widest scope consistent with the principles and features described herein.

Figure 1:
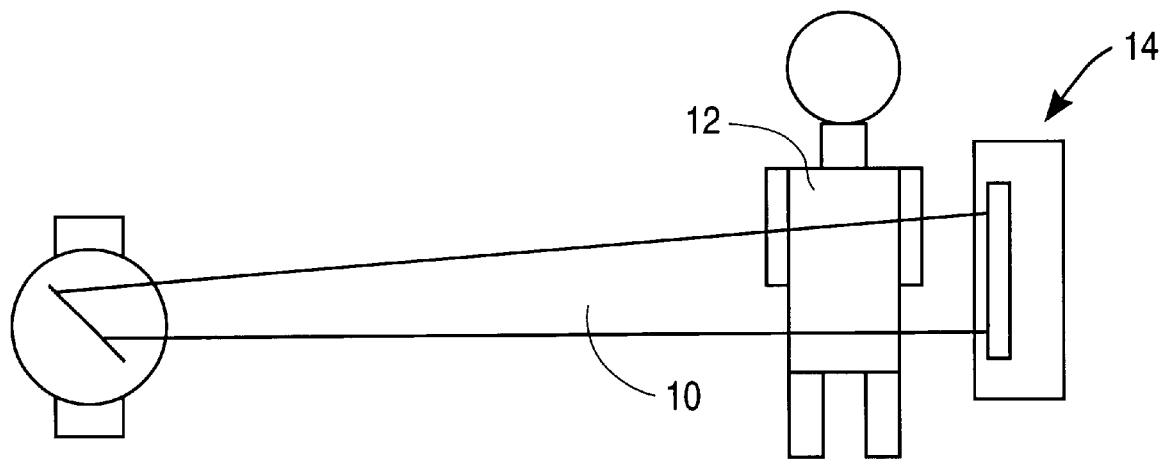
FIG. 1 illustrates a general diagram of a radiographic imaging environment in accordance with the present invention.

FIG. 1 illustrates a general diagram of a radiographic imaging environment in accordance with the present invention. As shown, x-ray signals 10 are transmitted toward an object 12, e.g., a patient, for imaging by a radiography system 14. In the present invention, radiography system 14 utilizes flat panel, active matrix technologies with a direct method approach to achieve the imaging of object 12, as described in greater detail with reference to FIGS. 2 and 3.

Figure 2:
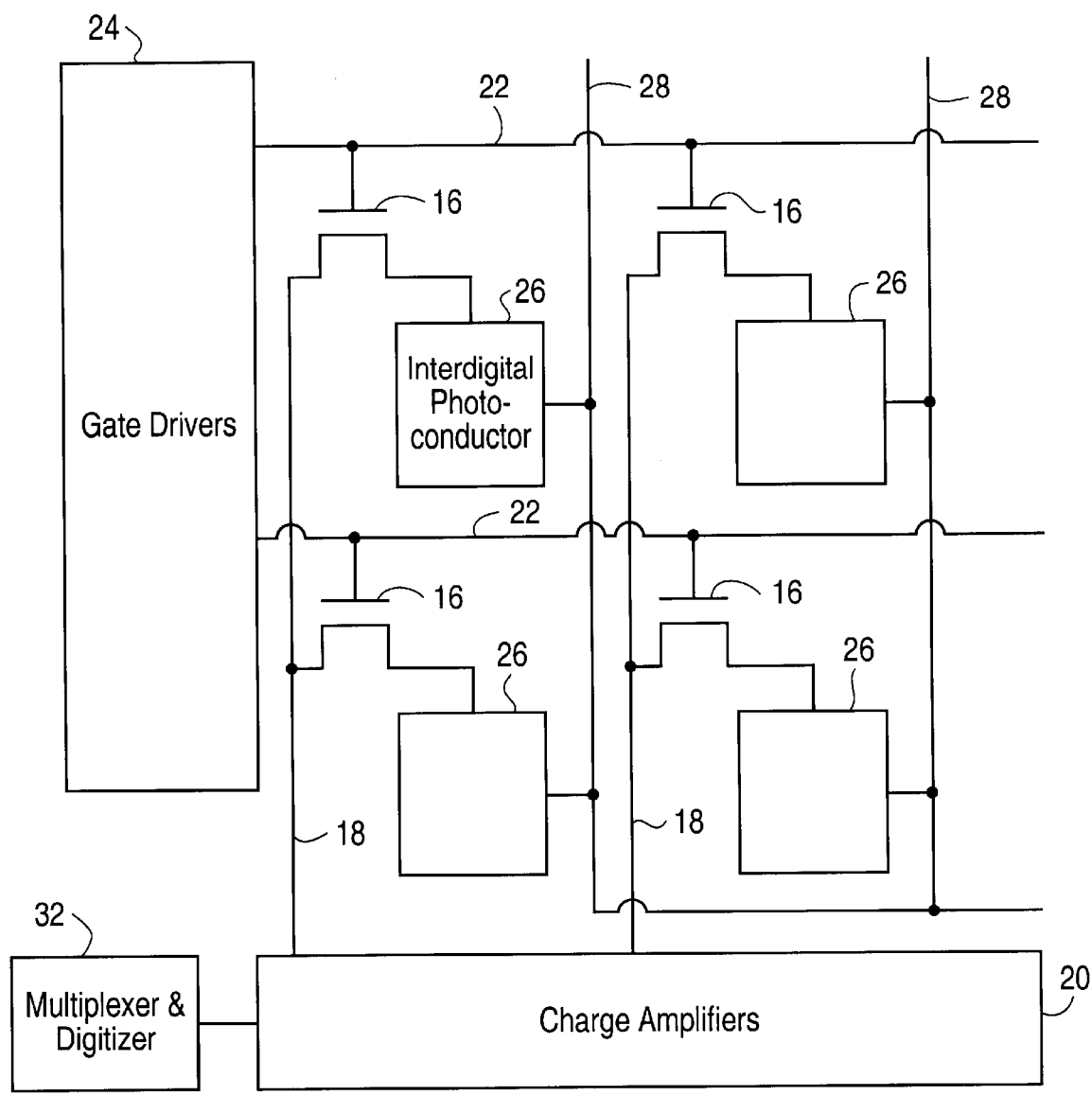
FIG. 2 illustrates a two-dimensional array structure within the radiography system of FIG. 1.

Within the radiography system 14 is a two-dimensional array structure illustrated by the block diagram of FIG. 2. TFTs 16, e.g., cadmium selenium (CdSe) TFTs for high carrier mobility and low leakage current or amorphous silicon (a-si) TFTs, are coupled by data lines 18 at their sources to a charge amplifier circuit 20. Gate lines 22 from a gate driver circuit 24 are coupled to the gates of the TFTs 16. The present invention further includes interdigital photoconductors 26 that are coupled between the TFTs 16 and a bias voltage 28. Also included in the array structure is a multiplexer and digitizer unit 32 that multiplexes and converts the analog signals from the charge amplifiers into digital signals for further image processing, as is well understood by those skilled in the art.

Figure 3:
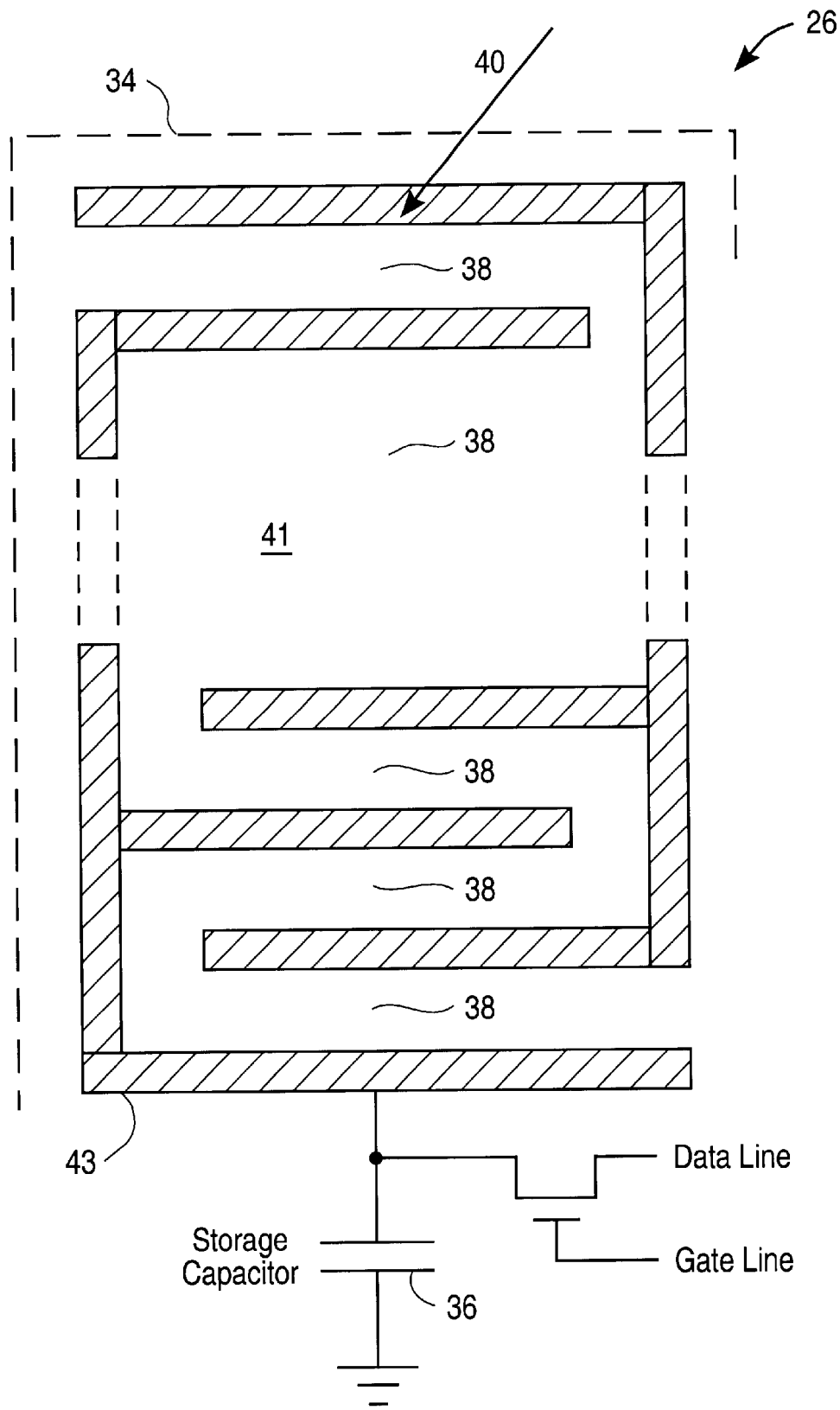
FIG. 3 illustrates the interdigital photoconductor of FIG. 2 in greater detail.

FIG. 3 illustrates the interdigital photoconductor 26 of the present invention in greater detail. Within each interdigital photoconductor 26 are a photoconductor element 34 and a storage capacitor 36. The photoconductor element 34 is formed with photoconductive material layer 38, i.e., α-Se, with an interdigital contact structure 41. The interdigital contact structure 41 is formed by depositing metallic electrodes in an interdigital pattern on the bulk or thickness of the photoconductive layer, e.g., Se, where the number of electrodes in each plurality is dependent upon specific design needs, including the x-ray energy and the stopping power of the electrodes. The interdigital contact structure 41 comprises a patterned plurality of electrodes 40 and 43. A first plurality of electrodes 40 are coupled to the positive output of bias voltage. The metallic electrodes 40, 43 increase the stopping power of x-ray and also emit secondary particles which generate new charge carriers in photoconducting layer 38. A second plurality of electrodes 43 are coupled to the storage capacitor 36.

X-rays absorbed by the photoconductive material 38 release charge carriers (electron-hole pairs) which are separated and drawn to the electrodes 40, 43 by the electric field created by the application of an electric voltage by a bias voltage 28 (FIG. 2). The collected charges by the electrodes 43 are stored on the storage capacitor 36. During read out, the TFTs 16 (FIG. 2) are turned on one row at a time to transfer the image charge from the storage capacitor 36 to the data lines 18 of the photoconductors 26 and then to the charge amplifiers 20.

Figure 4:
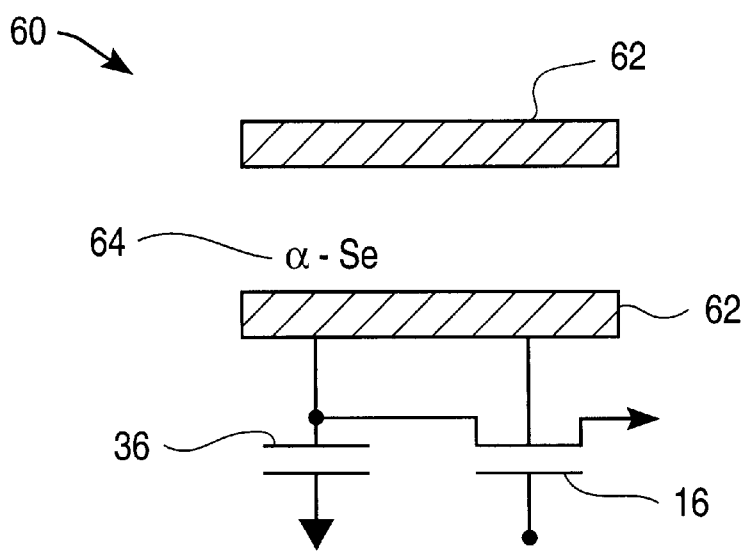
FIG. 4 illustrates a traditional photoconductive detector.

With the interdigital contact structure 41, the carriers generated in the photoconducting layer 38 have a shorter distance to travel before being collected, as compared to a traditional photoconductor element illustrated in FIG. 4. As shown in FIG. 4, a traditional photoconductive detector 60 is formed by two electrodes 62 separated with a photoconductive material 64, e.g., α-Selenium. The photoconductive material 64 is usually quite thick, e.g., on the order of 500 micron, in order to provide sufficient absorption of the penetrating x-ray radiation. Of course, the thickness of the photoconductive material 64 results in the need for the application of a significant voltage level, e.g., on the order of about 5 kV (kilovolts) for α-Selenium, since 10 V per micron are normally required to provide a sufficient electrical field in the α-Se.

The thickness of photoconducting layer 38 is determined by the x-ray energy, stopping power of metallic electrodes and gain-bandwidth product of photoconductor. The frequency response, or bandwidth, of the photoconductor generally refers to the activity of a single generated electron-hole pair. Once the carriers are moving toward the opposite electrodes, the current created persists until both carriers are collected at the electrodes or until they recombine in the bulk of the semiconductor. Thus, the time for detection of the current is limited by the transit time between the electrodes for the fastest charge carrier. In such cases, the highest frequency to which the photoconductor can respond, i.e., its maximum bandwidth, depends directly on minimizing the distance that the electrons must travel between electrodes.

With the use of an interdigital structure in accordance with the present invention, the gap between electrodes is reduced, which results in a very short photoconductive lag. Also, a small electrode gap supports an increase in the gain of the detector, since the gain is inversely proportional to the distance between the electrodes, which results in an increase in the signal to noise ratio (S/N) of the imaging system, while reducing the bias voltage for a certain electric field. The bias voltage is equal to the required electric field, e.g., 10 V/$\mu$m times the gap between the photoconductor electrodes. For instance, the gap between electrodes could be reduced to 1/50 of the gap of FIG. 4. This will reduce the bias voltage 50 times and therefore, will ease the required insulations and complexity that are necessary for high voltage bias. Also, a dielectric layer can be placed either between the top bias electrode and the conducting layer 38, or between the bottom electrode and the conducting layer 38.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A photoconductive element for direct x-ray detection in a radiography imaging system, the photoconductive element comprising:
   a photoconductive material layer for absorbing x-ray radiation transmitted through an object being imaged by the radiography imaging system; and
   an interdigital contact structure in the photoconductive material layer.

2. The photoconductive element of claim 1 wherein the interdigital contact structure comprises a patterned plurality of electrodes.

3. The photoconductive element of claim 2 wherein the patterned plurality of electrodes further comprises a first plurality of electrodes coupled together and a second plurality of electrodes coupled together, wherein the first and second plurality of electrodes are substantially parallel to each other.

4. The photoconductive element of claim 3 wherein the first plurality of electrodes is coupled to a power supply and the second plurality of electrodes is coupled to a storage capacitor.

5. The photoconductive element of claim 4 wherein the storage capacitor stores charges from the photoconductive material layer developed by the x-ray absorption.

6. The photoconductive element of claim 5 wherein the storage capacitor is further coupled to a thin film transistor.

7. The photoconductive element of claim 1 wherein the photoconductive material layer further comprises amorphous selenium.

8. A method for providing a photoconductive element for direct x-ray detection in a radiography imaging system, the method comprising:
   utilizing a photoconductive material layer for absorbing x-ray radiation transmitted through an object being imaged by the radiography imaging system; and providing an interdigital contact structure in the photoconductive material layer.

9. The method of claim 8 wherein the providing an interdigital structure comprises providing a patterned plurality of electrodes.

10. The method of claim 9 wherein providing the plurality of electrodes further comprises providing a first plurality of electrodes coupled together and providing a second plurality of electrodes, coupled together, wherein the first plurality of electrodes and the second plurality of electrodes are substantially parallel.

11. The method of claim 10 further comprising coupling the first plurality of electrodes to a power supply and coupling the second plurality of electrodes to a storage capacitor.

12. The method of claim 11 wherein the storage capacitor stores charges from the photoconductive material layer developed by the x-ray absorption.

13. The method of claim 12 further comprising coupling the storage capacitor to a thin film transistor.

14. The method of claim 8 wherein utilizing a photoconductive material layer further comprises utilizing amorphous selenium.

15. A two-dimensional active matrix array x-ray detector for a radiography imaging system comprising:

a plurality of photoconductive elements responsive to x-ray radiation absorption in a photoconductive layer, each of the plurality of photoconductive elements including an interdigital contact structure;

a plurality of thin film transistors coupled to the plurality of photoconductive elements;

a gate driver circuit driving a gate line of each thin film transistor;

a charge amplifier circuit for amplifying a data signal from a source of each thin film transistor; and a multiplexer and digitizer circuit for converting signals from the charge amplifier circuit to digital form for utilization in radiographic image formation.

16. The detector of claim 15 wherein each of the photoconductive elements further comprises a storage capacitor coupled to the interdigital contact structure.

17. The detector of claim 15 wherein the interdigital contact structure further comprises a first plurality of electrodes coupled together and a second plurality of electrodes coupled together, wherein the first and second plurality of electrodes are substantially parallel to each other.

18. The detector of claim 17 wherein the first plurality of electrodes is coupled to the power supply and the second plurality of electrodes is coupled to the storage capacitor.

19. The detector of claim 15 wherein the photoconductive material layer further comprises amorphous selenium.

* * * * *